US008482484B2

(12) United States Patent
Yamazaki et al.

(10) Patent No.: US 8,482,484 B2
(45) Date of Patent: Jul. 9, 2013

(54) DISPLAY DEVICE AND ELECTRONIC DEVICE

(75) Inventors: Shunpei Yamazaki, Tokyo (JP); Yasuko Watanabe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 986 days.

(21) Appl. No.: 11/620,439

(22) Filed: Jan. 5, 2007

(65) Prior Publication Data

US 2007/0108454 A1 May 17, 2007

Related U.S. Application Data

(63) Continuation of application No. 10/872,398, filed on Jun. 22, 2004, now Pat. No. 7,161,185.

(30) Foreign Application Priority Data

Jun. 27, 2003 (JP) .................................. 2003-185517

(51) Int. Cl.
*G09G 5/00* (2006.01)
(52) U.S. Cl.
USPC ......... 345/4; 345/5; 345/76; 345/175; 257/88
(58) Field of Classification Search
USPC ........ 345/30–107, 1.1, 4, 5, 173, 175; 257/88
See application file for complete search history.

(56) References Cited

U.S. PATENT DOCUMENTS

| 4,333,715 A | * | 6/1982 | Brooks | 352/98 |
| 5,396,406 A | * | 3/1995 | Ketchpel | 362/27 |

(Continued)

FOREIGN PATENT DOCUMENTS

| JP | 09-127885 | 5/1997 |
| JP | 10-255976 | 9/1998 |

(Continued)

OTHER PUBLICATIONS

Documents distributed in the "13th Flat Panel Display Manufacturing Technology Expo & Conference" by ELDis Group (5 pages), Jul. 2, 2003.

(Continued)

*Primary Examiner* — Dmitriy Bolotin
(74) *Attorney, Agent, or Firm* — Fish & Richardson P.C.

(57) ABSTRACT

A display device and an electronic device in which more sophistication and a high added value are realized by obtaining a read function by incorporating an imaging device, and by using a panel with small volume can be provided. A display device and an electronic device according to the invention has a first display surface and a plurality of pixels arranged in matrix over one surface of a light transmitting substrate and a second display surface over the other surface of the substrate. The plurality of pixels are each provided with a transistor, an imaging device, and a light-emitting element which emits light to the first display surface and the second display surface. The light-emitting element has two functions of serving as a light source when information of a subject is read and displaying an image. Thus, a display device according to the invention has two functions of an image sensor function to read information of a subject by using an imaging device and a display function to display an image by using the imaging device and the light-emitting element.

41 Claims, 17 Drawing Sheets

U.S. PATENT DOCUMENTS

| | | | |
|---|---|---|---|
| 6,132,048 A * | 10/2000 | Gao et al. | 353/20 |
| 6,392,340 B2 * | 5/2002 | Yoneda et al. | 313/506 |
| 6,466,292 B1 | 10/2002 | Kim | |
| 6,724,012 B2 | 4/2004 | Kimura | |
| 6,747,290 B2 | 6/2004 | Yamazaki | |
| 6,747,609 B2 * | 6/2004 | Antila et al. | 345/1.1 |
| 6,801,185 B2 | 10/2004 | Salley | |
| 6,861,710 B2 | 3/2005 | Murakami | |
| 6,897,914 B2 | 5/2005 | Yoshida | |
| 7,019,714 B2 * | 3/2006 | Uchida et al. | 345/3.1 |
| 7,034,451 B2 | 4/2006 | Senbonmatsu | |
| 7,148,502 B2 * | 12/2006 | Yamazaki et al. | 257/40 |
| 2001/0045565 A1 | 11/2001 | Yamazaki | |
| 2001/0055841 A1 | 12/2001 | Yamazaki | |
| 2002/0044208 A1 | 4/2002 | Yamazaki | |
| 2002/0074551 A1 | 6/2002 | Kimura | |
| 2002/0079512 A1 * | 6/2002 | Yamazaki et al. | 257/200 |
| 2002/0111195 A1 * | 8/2002 | Kweon et al. | 455/566 |
| 2002/0122123 A1 | 9/2002 | Kimura | |
| 2002/0191135 A1 * | 12/2002 | Kim | 349/113 |
| 2003/0052324 A1 | 3/2003 | Kimura | |
| 2003/0189528 A1 * | 10/2003 | Antila et al. | 345/1.1 |
| 2003/0210360 A1 * | 11/2003 | Yoshida | 349/96 |
| 2003/0231483 A1 * | 12/2003 | Higashiyama | 362/31 |
| 2004/0004434 A1 | 1/2004 | Nishi | |
| 2004/0169624 A1 | 9/2004 | Yamazaki | |
| 2004/0195965 A1 | 10/2004 | Yamazaki | |
| 2004/0201341 A1 | 10/2004 | Miyachi | |
| 2004/0226200 A1 | 11/2004 | Salley | |
| 2004/0227698 A1 | 11/2004 | Yamazaki | |
| 2004/0245918 A1 | 12/2004 | Lee | |
| 2004/0251823 A1 | 12/2004 | Park | |
| 2004/0257473 A1 | 12/2004 | Miyagawa | |
| 2004/0263066 A1 * | 12/2004 | Abe et al. | 313/504 |
| 2005/0024339 A1 | 2/2005 | Yamazaki | |
| 2005/0030518 A1 | 2/2005 | Nishi | |
| 2005/0062407 A1 | 3/2005 | Suh | |

FOREIGN PATENT DOCUMENTS

| | | |
|---|---|---|
| JP | 10-255976 A | 9/1998 |
| JP | 2001-086205 | 3/2001 |
| JP | 2001-285445 | 10/2001 |
| JP | 2001-332392 | 11/2001 |
| JP | 2001-343908 | 12/2001 |
| JP | 2001-356714 | 12/2001 |
| JP | 2002-156920 | 5/2002 |
| JP | 2002-176162 | 6/2002 |
| JP | 2002-237923 A | 8/2002 |
| JP | 2003-036974 A | 2/2003 |
| JP | 3408154 | 5/2003 |
| JP | 2004-039542 | 2/2004 |
| JP | 2004-095340 A | 3/2004 |
| WO | 01/80204 A2 | 10/2001 |

OTHER PUBLICATIONS

Exhibition of Active Matrix Type Organic EL Display at "13$^{th}$ Flat Panel Display Manufacturing Technology Expo & Conference" by ELDis Group (in Japanese with full translation); Jul. 2, 2003.

"Mass Production of Organic EL Devices"; *Shimotsuke Newspaper* (in Japanese with full translation); Jul. 3, 2003.

"Two-way display developed"; *The Japan Times*; (1 page); Jul. 3, 2003.

* cited by examiner

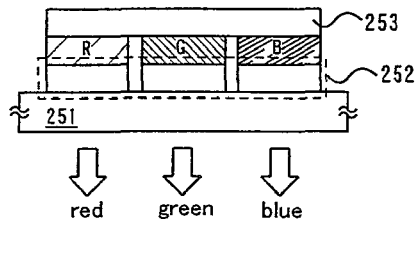
FIG. 4A
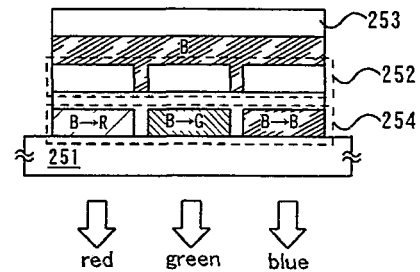
FIG. 4B
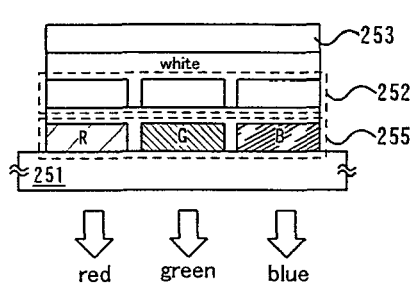
FIG. 4C
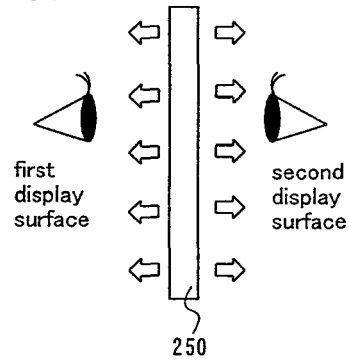
FIG. 4D
FIG. 4E
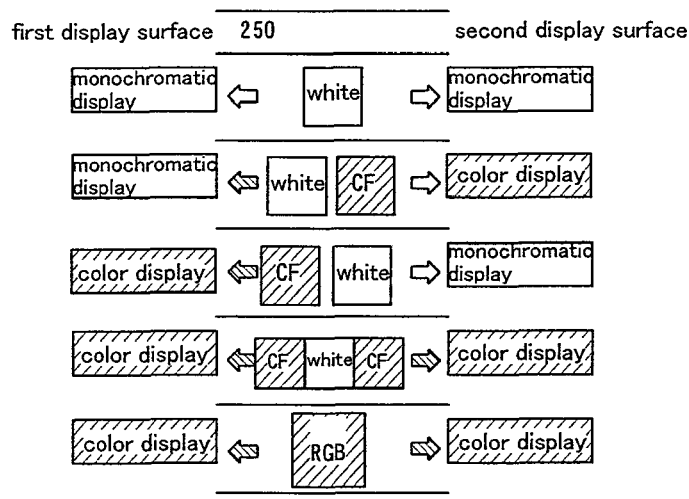

317 business card
320 business card
320

FIG. 10A  FIG. 10B  FIG. 10C
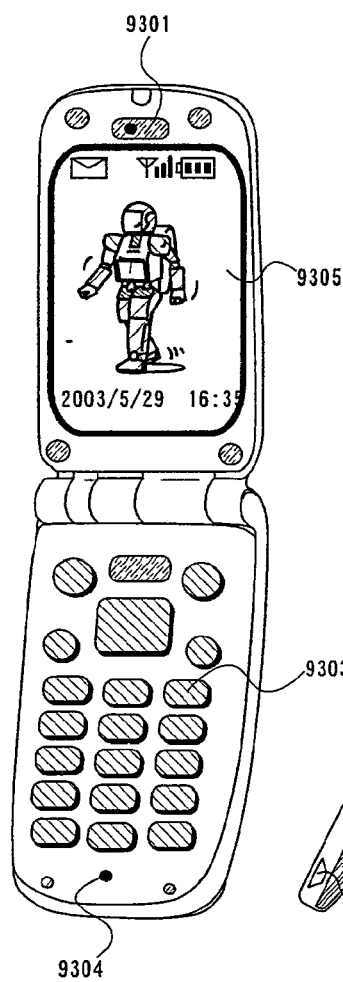
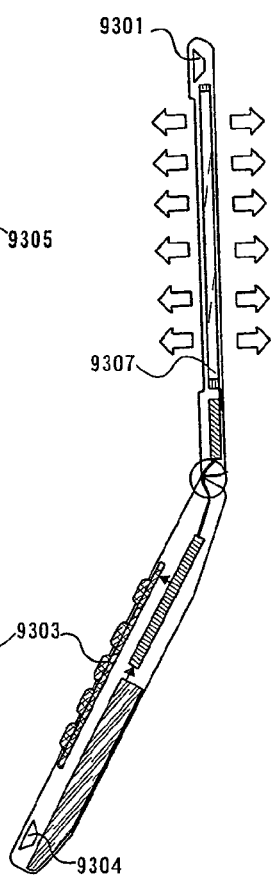
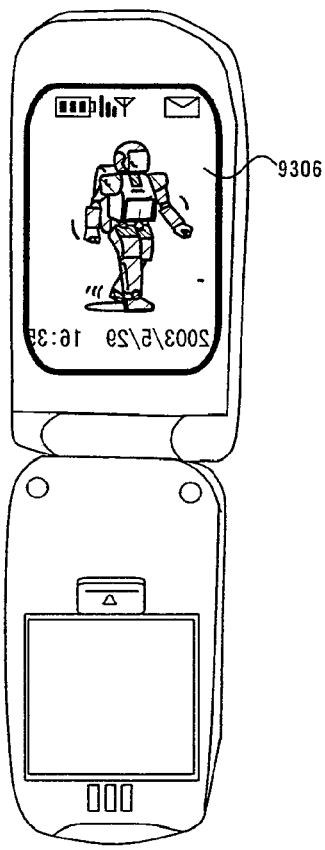
FIG. 10D  FIG. 10E  FIG. 10F
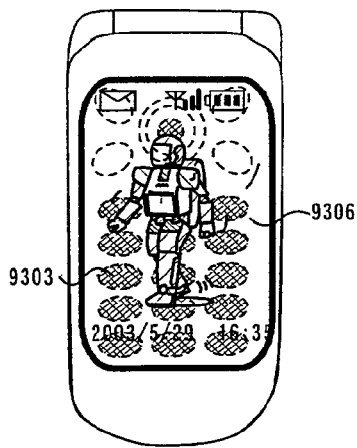
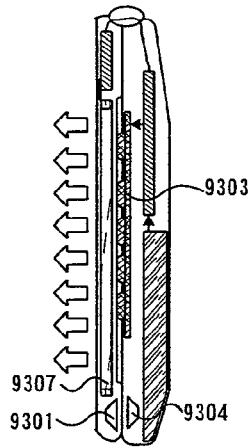
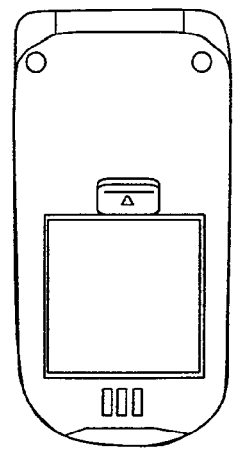

first display surface 403  401  405 second display surface

202

202

202 ridge ending
ridge bifurcation

DISPLAY DEVICE AND ELECTRONIC DEVICE

BACKGROUND OF THE INVENTION

1. Field of the Invention

The present invention relates to a display device having a display function using a light-emitting element and a read function using the light-emitting element and an imaging device. Further, the invention relates to a display device having display surfaces on both sides.

2. Description of the Related Art

In recent years, as for a display device, research and development of display devices using light-emitting elements typified by electroluminescent elements is pushed forward instead of liquid crystal displays. Such a display device is widely used by utilizing advantages such as high image quality and wide viewing angle due to light emitting properties, and thinness and light weight that are achieved since it does not require a backlight. Further, there is a display device having a display function and a read function provided by integrating light-emitting elements and imaging devices into the display device (for example, Reference 1: Japanese Patent Laid-Open No. 2002-176162).

Further, among electronic devices each comprising a display surface, use of portable terminals is increased in particular, and further more sophistication and a high added value are demanded. Accordingly, a portable terminal having a sub display surface as well as a main display surface has been developed.

As to an electronic device provided with a sub display surface as well as a main display surface, the volume occupied by a module including a backlight and the like and the volume occupied by a control IC for driving the module are not negligible. In particular, portable terminals offered lately are remarkably reduced in weight, thickness, and size and that is a trade off for the high added value.

Further, in a portable terminal having a sub display surface, display surfaces of both sides are back to back. Accordingly, only one display surface has been able to be seen exclusively in either case a cellular phone is opened or closed despite two display surfaces are provided. Further, in the case of an electronic device of a folding type, it must be opened from the folded position to see the display surface inside, and thus causing a considerable inconvenience.

BRIEF SUMMARY OF THE INVENTION

Therefore, it is an object of the present invention to provide a display device and an electronic device having display surfaces on both sides, in which more sophistication and a high added value are realized by obtaining a read function by incorporating an imaging device, and by using a panel with small volume. Further, it is another object of the invention to provide a folding electronic device in which a display surface inside can be seen without opening and a display surface outside can be seen without closing the electronic device.

The following measures are taken in the invention to solve the problems of the related art.

It is a feature of a display device of the invention that a plurality of pixels arranged in matrix and a first display surface are provided over one surface of a light transmitting substrate; a second display surface is provided over the other surface of the substrate; and each of the plurality of pixels has a transistor, an imaging device, and a light-emitting element which emits light to the first display surface and the second display surface.

Further, the display device has a switching circuit which selects one display mode for the first or the second display surface from the followings: normal display, horizontally reversed display, 180° rotated display, and vertically reversed display. This switching circuit enables optional and easy change of the above each display mode. The switching circuit is provided so that users can see the display easily depending on the user's viewing angle.

It is a feature of a display device of the invention that a transistor is provided over one surface of a light transmitting substrate; a light-emitting element which emits light to a first display surface and a second display surface is provided above the transistor; an imaging device is provided above the light-emitting element; the first display surface is provided over the one surface of the substrate; and the second display surface is provided over the other surface of the substrate.

It is a feature of a display device of the invention that a transistor and an imaging device are provided over one surface of a light transmitting substrate; a light-emitting element which emits light to a first display surface and a second display surface is provided above the transistor and the imaging device; the first display surface is provided over the one surface of the substrate; and the second display surface is provided over the other surface of the substrate.

As above, for the positional relationship of a transistor, a light-emitting element, and an imaging device, an arrangement in which the imaging device is formed in a layer above the light-emitting element and another arrangement in which the imaging device is formed in the same layer as the transistor are mostly proposed. Note that it is preferable to use an amorphous semiconductor for the semiconductor forming the imaging device since an amorphous semiconductor has high photoconductivity. Further, each semiconductor forming the imaging device is formed based on vertical junction or lateral junction.

Further still, it is another feature of the invention having the above structure that light emitted from the light-emitting element reflects off a subject and irradiates the imaging device. In this way, a read function can be used. Moreover, the imaging device, is equivalent to an element generating signal charge in response to incident light, for example, is equivalent to a CCD image sensor, an MOS (metal-oxide-semiconductor) image sensor, a CMD (charge modulation device), a charge injection device, a bipolar image sensor, a photoconductive film image sensor, a contact image sensor, a stacked CCD, an infrared image sensor, or the like.

As to a display device of the invention, a substrate and a counter substrate which is opposite the substrate are sandwiched between at least two polarizers which polarize light in different directions. When two polarizers are used, one or both of the two polarizers are provided with a plurality of openings. The openings are provided over the imaging device for improving the reading accuracy.

The invention having the above structure provides a display device and an electronic device in which more sophistication and a high added value are realized by obtaining a read function by incorporating an imaging device, and by using a panel with small volume. Further, the invention provides a folding electronic device in which a display surface inside can be seen without opening and a display surface outside can be seen without closing the electronic device.

A light-emitting element included in a display device according to the invention has two functions of serving as a light source when information of a subject is read and displaying an image. Further, a display device according to the invention has two functions of an image sensor function to read information of a subject and a display function to display an image. Despite the display device of the invention has such two functions, a light source or a light scatterer which are usually required in the case of using an image sensor function are not required to be provided separately. Therefore, the display device can be made far smaller, thinner, and lighter.

BRIEF DESCRIPTION OF THE DRAWING

FIGS. 4A to 4E show a technique of full color display with the use of a light-emitting element.

FIGS. 10A to 10F show an electronic device using a display device of the invention.

DETAILED DESCRIPTION OF THE INVENTION

Embodiment Mode

Figure 1A:
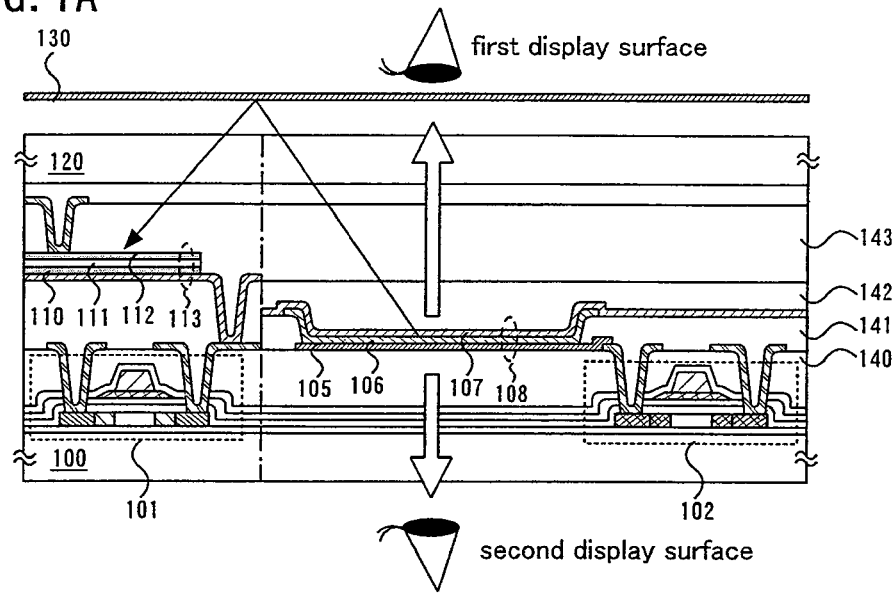
FIGS. 1A and 1B show a cross-sectional structure of a display device of the invention.

An embodiment mode according to the invention will be described in detail with reference to the drawings. Note that the invention is not limited to the following discussion and the fact that the modes and details can be changed variously without departing from the gist and the scope of the invention can easily be understood by a person skilled in the art. Accordingly, the invention is not to be interpreted limiting to the description of the embodiment mode and embodiments below. Note that, in a structure of the invention described below, reference numerals denoting the same parts are used in common in different drawings. Further, a transistor using a crystalline semiconductor or an amorphous semiconductor is given as a switching element or a driving element in the following embodiment mode; however, the invention is not particularly limited thereto. For example, an organic material, a single crystal, a transistor using a carbon nanotube, or the like may be used alternatively. Further, in the following embodiment mode, a photodiode having a pin-junction is given as an example for an imaging device. An imaging device denotes an element generating signal charge in response to incident light. For example, a pn-junction photodiode, a CCD image sensor, a MOS image sensor, a CMD, a charge injection device, a bipolar image sensor, a photoconductive film image sensor, a contact image sensor, a stacked CCD, an infrared image sensor, an avalanche photodiode (APD) which is made high sensitive using electron avalanche caused by increasing voltage, or the like may be used.

A display device in the invention includes an image display device, a light emitting device, and a light source (including a lighting system). Further, the display device further includes a panel which enclosed a pixel area having a light-emitting element and a driver circuit between a substrate and a cover material, a module in which an FPC is attached to the panel, a module in which a driver IC is provided at the point of the FPC, the module in which a driver IC is mounted on the panel by COG technology, and a display used for a monitor.

In this embodiment mode, a cross-sectional structure of a display device according to the invention which has display surfaces (display screens) on both sides and in which imaging devices are integrated will be described with reference to FIGS. 1A to 2.

First, the case where a vertical junction imaging device 113 is formed in a layer above a light-emitting element 108 will be described with reference to FIG. 1A. In FIG. 1A, a driver transistor 102 including a crystalline semiconductor (for example, polycrystal such as polysilicon), a first electrode (a pixel electrode) 105, an electroluminescent layer 106 and a second electrode (a counter electrode) 107 are provided over a light transmitting substrate 100. A laminate of the first electrode 105, the electroluminescent layer 106, and the second electrode 107 is equivalent to the light-emitting element 108.

In the invention, the first electrode 105 and the second electrode 107 are formed of a light transmitting material. Accordingly, the light-emitting element 108 emits light in a first direction toward a substrate 100 and second direction opposite to the first direction, and has two display areas. A light transmitting materials forming the first electrode 105 and the second electrode 107 can use a material such as a transparent conductive film of ITO or the like, or an aluminum film that is formed thin enough to transmit light. Further, the substrate 100 and a counter substrate 120 provided over the imaging device 113 are transparent/translucent.

A transistor 101, an n-type semiconductor 110, an i-type semiconductor (intrinsic semiconductor) 111, and a p-type semiconductor 112 are provided over the light transmitting substrate 100. A laminate of the n-type semiconductor 110, the i-type semiconductor 111, and the p-type semiconductor 112 is equivalent to the imaging device 113. The i-type semiconductor 111 is a semiconductor with high purity, which is not doped with anything.

In the structure shown in FIG. 1A, the transistor 101 and the driver transistor 102 are provided over the substrate 100 and an insulating film 140 is provided so as to cover the transistor 101 and the driver transistor 102. An insulating film 141 serving as a bank of the light-emitting element is provided over the insulating film 140, an insulating film 142 is provided over the insulating film 141 and an insulating film 143 is provided over the insulating film 142. The light-emitting element 108 is provided over the insulating film 140, and the imaging device 113 is provided over the insulating film 142.

Figure 1B:
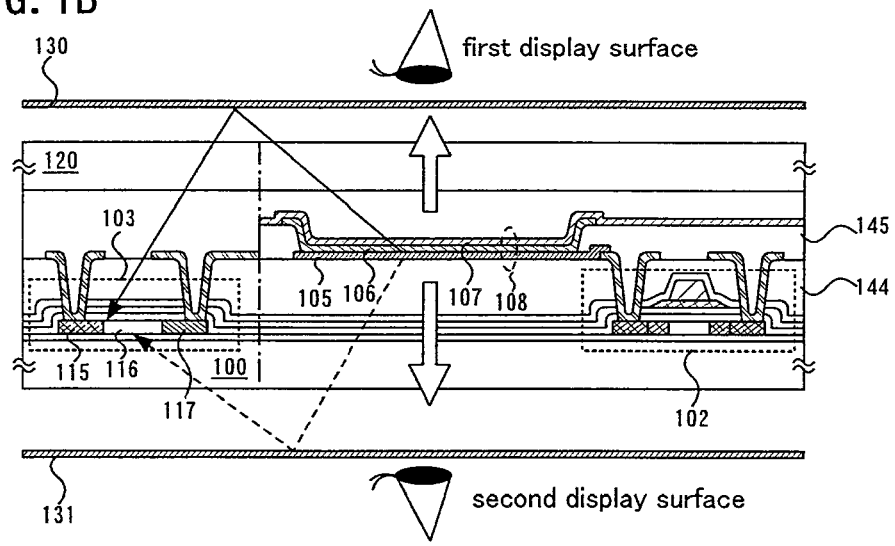

The case where the lateral junction imaging device 103 is formed in the same layer as a transistor including a crystalline semiconductor is shown in FIG. 1B. Since the structure in which the driver transistor 102 and the light-emitting element 108 are provided over the light transmitting substrate 100 in FIG. 1B is the same as FIG. 1A, the explanation will be omitted here. An n-type semiconductor 115, an i-type semiconductor 116, and a p-type semiconductor 117 are provided in the same layer as the driver transistor 102, and an element including these semiconductors is equivalent to the imaging device 103.

Figure 2:
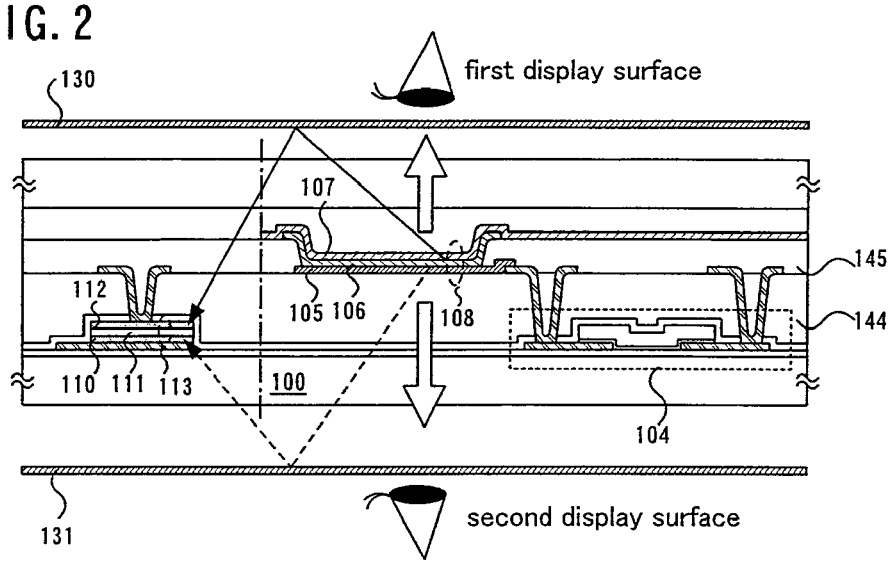
FIG. 2 shows a cross-sectional structure of a display device of the invention.

The case where the vertical junction imaging device 113 is formed in the same layer as a transistor in which a channel region is formed from an amorphous semiconductor (amorphous silicon) is shown in FIG. 2. In FIG. 2, a driver transistor 104 including an amorphous semiconductor, a first electrode 105, an electroluminescent layer 106, and a second electrode 107 are provided over the light transmitting substrate 100. Further, the n-type semiconductor 110, the i-type semiconductor 111, and the p-type semiconductor 112 are provided in the same layer as the driver transistor 104, and a laminate thereof is equivalent to the imaging device 113.

In the structure shown in FIG. 1B, the driver transistor 102 and the imaging device 103 are provided over the substrate 100, and an insulating film 144 is provided so as to cover the driver transistor 102 and the image device 103. An insulating film 145 serving as a bank of the light-emitting element 108 is provided over the insulating film 144.

Note that, for improvement of current capacity, it is preferable that channel width W/channel length L of the driver transistor which is connected in series with the light-emitting element is set at 1 to 100 (preferably 5 to 20). Specifically, it is preferable to set the channel length at 5 μm to 15 μm, and the channel width W at 20 μm to 1200 μm (preferably, 40 μm to 600 μm). Note that, when the channel width W and the channel length L are set as above, the area of the transistor in a pixel would be increased. In that case, top emission is preferable in which a light-emitting element emits light in a direction opposite to the substrate 100.

When the transistor including an amorphous semiconductor is provided in a pixel as above, it is difficult to form a driver circuit also from a transistor containing an amorphous semiconductor. Therefore, it is preferable to provide a driver IC as a driver circuit by TAB or COG technology.

As described above, each semiconductor forming the imaging device is formed with vertical junction (FIG. 1A and FIG. 2) or lateral junction (FIG. 1B). Further, for the positional relationship of a transistor, a light-emitting element, and a imaging device, an arrangement in which the imaging device is formed in a layer above the light-emitting element (FIG. 1A) and another arrangement in which the imaging device is formed in the same layer as the transistor (FIG. 1B and FIG. 2) are given. Further, it is not illustrated; however, the imaging device may be formed in a layer below the light-emitting element. In each case of the above, the structure in which the light-emitting element is formed above the transistor is not changed. Note that it is preferable to use an amorphous semiconductor for the semiconductor forming the imaging device since an amorphous semiconductor has high photoconductivity.

A display device of the invention having the above structure has display surfaces on both sides, and thus, a display device and an electronic device in which more sophistication and a high added value are realized can be provided. Further, a display device of the invention uses a light-emitting element as a light source, and an imaging device as an image sensing element. A light-emitting element and an imaging device are provided over the same substrate. Light emitted from the light-emitting element reflects off a subject 130 or 131, and the reflected light enters the imaging device. Then, potential difference between both electrodes of the imaging device changes, and a current flows between the both electrodes in response to the changed potential difference. Information of a subject 130 or 131 can be obtained by detecting the amount of the current. The obtained information is displayed by the light-emitting element. A light-emitting element included in a display device according to the invention has two functions of serving as a light source when information of a subject is read and displaying an image. Further, a display device according to the invention has two functions of an image sensor function to read information of a subject and a display function to display an image. Despite the display device of the invention has such two functions, a light source or a light scatterer which are usually required in the case of using an image sensor function are not required to be provided separately. Therefore, the display device can be made far smaller, thinner, and lighter.

EMBODIMENTS

Embodiment 1

Figure 14A:
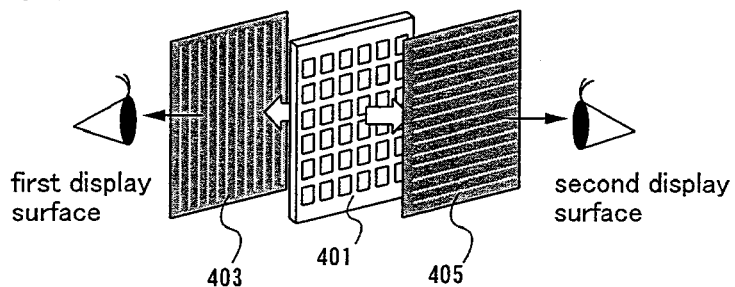
FIGS. 14A to 14C show a structure of a display device of the invention.

This embodiment will be described with reference to FIGS. 14A to 16C. First, an embodiment of providing polarizers for both sides of a display device of the invention will be described (FIG. 14A). In other words, an embodiment of providing a polarizer 403 and a polarizer 405 for both sides of a panel 401 will be described. In this case, external light can be intercepted by arranging two polarizers provided over the both sides so that polarization directions of light are mutually perpendicular. Further, light emitted from a light-emitting element passes through only one polarizer, and thus, display can be performed. With the above structure, except the area where light-emitting element illuminates, no light comes out and background can not be seen through from either side. However, light emitted from the light-emitting element is reduced in passing through the polarizer. Accordingly, when a read function is used, luminous intensity should be set higher than normal.

Figure 14B:
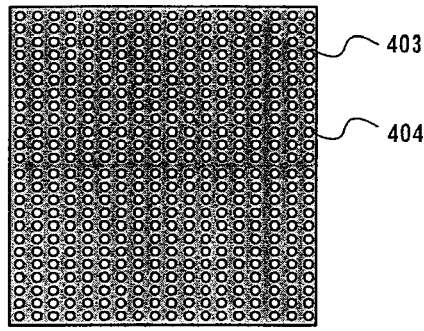
Figure 14C:
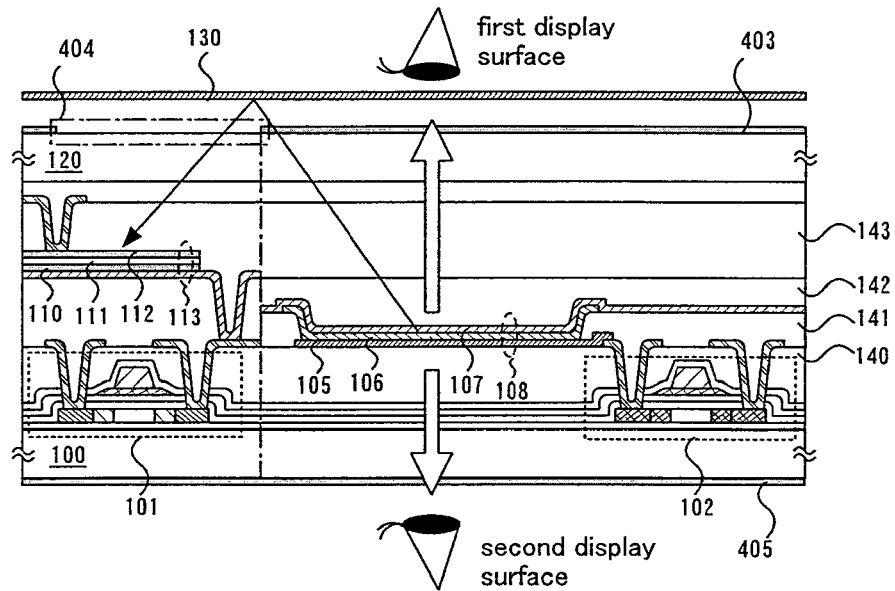

Further, an opening 404 may be provided in the polarizer 403 to improve reading accuracy (FIG. 14B). A cross-sectional structure in this case is as shown in FIG. 14C. Since light reflected from a subject 130 is not reduced by the polarizer 403 in the structure, reading accuracy is improved.

Note that, in this embodiment, the opening 404 is provided only in one polarizer (the polarizer 403); however, the invention is not limited thereto. An opening may be provided in each polarizer provided on both sides. Further, the shape of the opening may be any shape of circle, rectangle, or the like and the size is not either limited in particular. However, it is preferable that an opening be provided above the imaging device 103, and the opening have the same shape as the imaging device. The openings may be formed by physical means or by using photolithography technology.

Figure 16A:
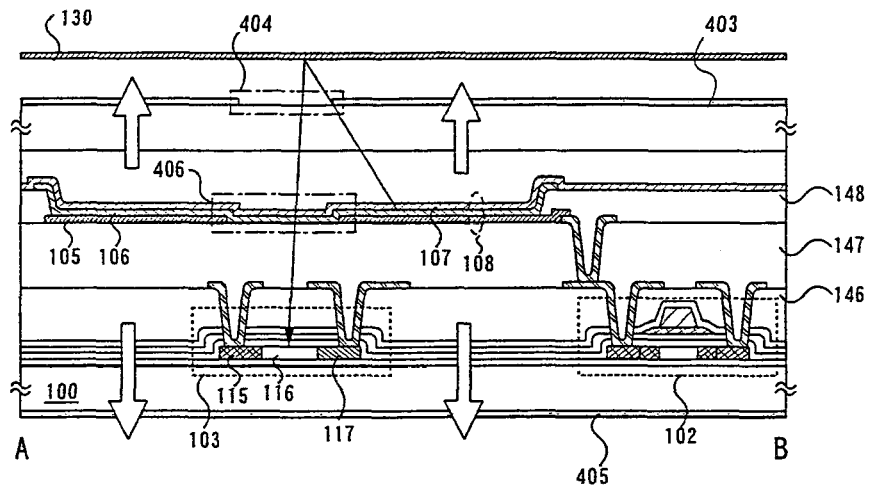
FIGS. 16A to 16C show a cross-sectional structure of a display device of the invention.
Figure 16B:
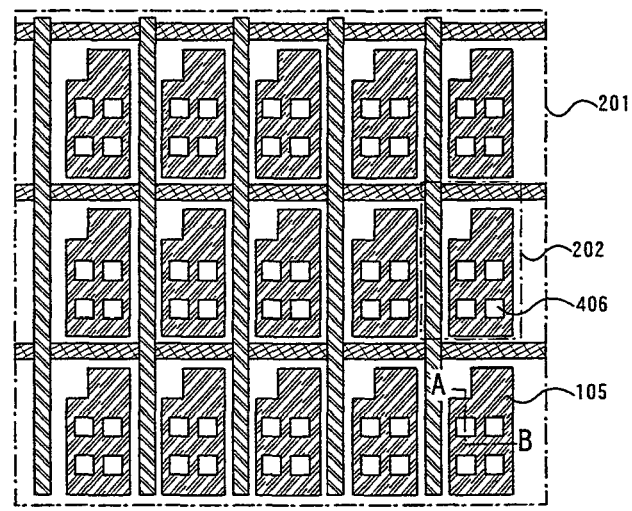
Figure 16C:
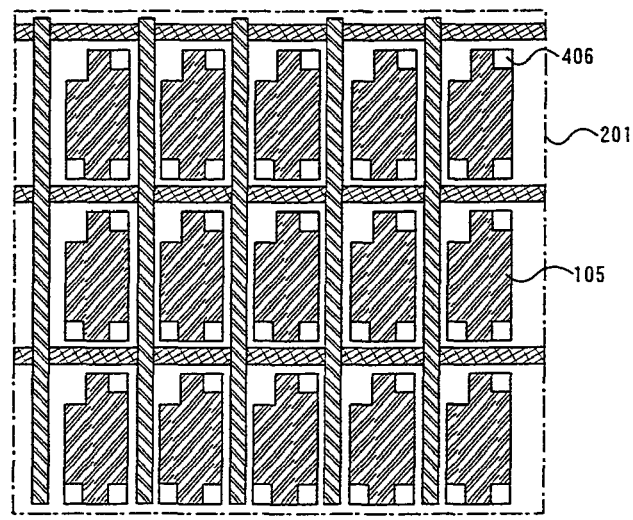

Next, an embodiment of providing an opening for a pixel electrode will be described. A plurality of pixels 202 are arranged in matrix in a pixel area 201, and a first electrode 105 is provided in each of the pixels 202 (FIGS. 16B and 16C). Each first electrode 105 has an opening 406. The position where the opening 406 is provided is not limited in particular, and may be provided in a central part (FIG. 16B) or in an end portion (FIG. 16C). Further, the opening 406 provided for the first electrode 105 is designated to overlap with the opening 404 provided for the polarizer 403, and in addition, the imaging device 103 may be provided below the openings 404 and 406. In other words, when a plurality of openings 406 are provided for the first electrode 105, a plurality of imaging devices 103 are provided for one pixel.

Note that, in the above cross-sectional structure, the driver transistor 102 and the imaging device 103 are provided over the substrate 100, an insulating film 147 is provided over the insulating film 146, and an insulating film 148 serving as a bank of a light-emitting element 108 is provided over the insulating film 147.

Note that, in the above cross-sectional structure, an opening is provided in each of the first electrode 105 and the polarizer 403; however, the invention is not limited thereto. An opening may provide only in the first electrode 105 or only in the polarizer 403. Further, even in the case of providing an opening in one or both of the first electrode 105 and the polarizer 403, an opening may be provided in every several pixels, and may be provided only in a part of the area without being regularly provided in every pixel. The manner of providing the opening may provide a trade off between the brightness in using the display function and reading accuracy in using the read function; thus, the manner may be set depending on the usage of the display device of the invention.

This embodiment can be freely combined with the above embodiment mode.

Embodiment 2

This embodiment describes a manner of arranging a sub-pixel having a light-emitting element and a sub-pixel having an imaging device with reference to FIGS. 3A to 15C.

Figure 15A:
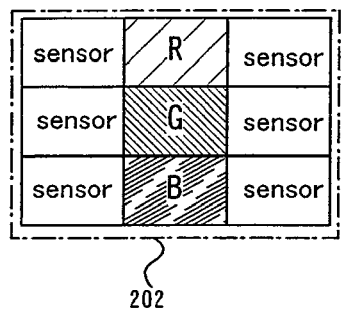
FIGS. 15A to 15C show a pixel of a display device of the invention.
Figure 15B:
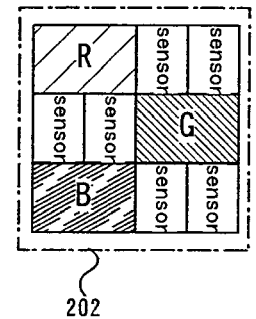

A display device of the invention includes a pixel area 201 having a plurality of pixels 202 arranged in matrix (FIG. 3A), and each of pixels 202 includes a sub-pixel having a light-emitting element and a sub-pixel having an imaging device (sensor). The configuration of the each pixel 202 may varies; for example, a case where one pixel has six sub-pixels in total including three sub-pixels each having a light-emitting element which emit light of each color of RGB and three sub-pixels each having an imaging device (FIG. 3B); another case where one pixel has four sub-pixels in total including three sub-pixels each having a light-emitting element which emit light of each color of RGB and a sub-pixel having an imaging device (FIG. 3C); and yet another case where one pixel has two sub-pixels in total including a sub-pixel having a light-emitting element which emits light of white and a sub pixel having an imaging device (FIG. 3D) can be given. Further, a case where one pixel has nine sub-pixels in total including three sub-pixels each having a light-emitting element which emit light of each color of RGB and six sub-pixel each having an imaging device (FIGS. 15A and 15B); another case where one pixel has seven sub-pixels in total including one sub-pixel having a light-emitting element which emits light of white and six sub-pixels each having an imaging device (FIG. 15C) can be given. In FIGS. 15A and 15B, the numbers of sub-pixels forming one pixel are the same; however, the area occupied by a sub-pixel having an imaging device is different.

The invention may use any of the above cases, and one of them can be selected in consideration of the sensibility of the sensor or the brightness of the display surface. Obviously, as more sub-pixels each having an imaging device are included, the reading accuracy is improved. Further, the reading accuracy is improved when one pixel is provided with a multiple of sub-pixels each having an imaging device and each occupying small area.

Figure 3A:
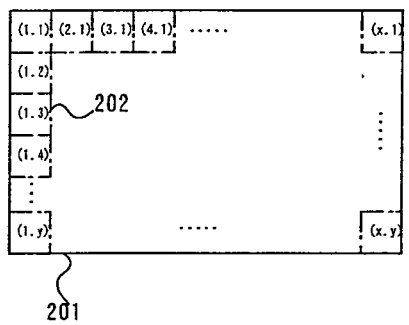
FIGS. 3A to 3E show a pixel of a display device of the invention and an equivalent circuit schematic of the pixel.
Figure 3B:
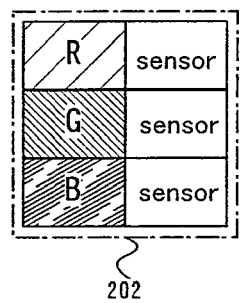
Figure 3C:
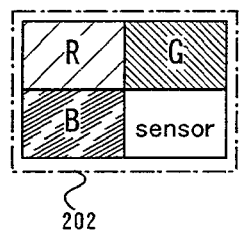
Figure 3D:
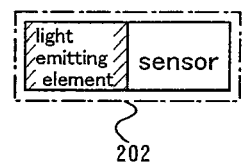
Figure 15C:
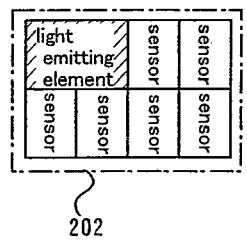

Note that, pixels shown in FIGS. 3B and 3C, and FIGS. 15A and 15B perform color display and pixels shown in FIG. 3D and FIG. 15C perform monochrome display. When pixels have a display function for performing monochrome display, the read function is limited to monochrome. Meanwhile, when a pixel has a display function for performing color display, the read function operates in color or monochrome. Note that, when information of a subject is read in color, light-emitting elements corresponding to each color of RGB are illuminated in turn, and information of a subject is read by imaging devices. Thereafter, information read in each color of RGB is combined, and a color image can be displayed by using the combined information.

Figure 3E:
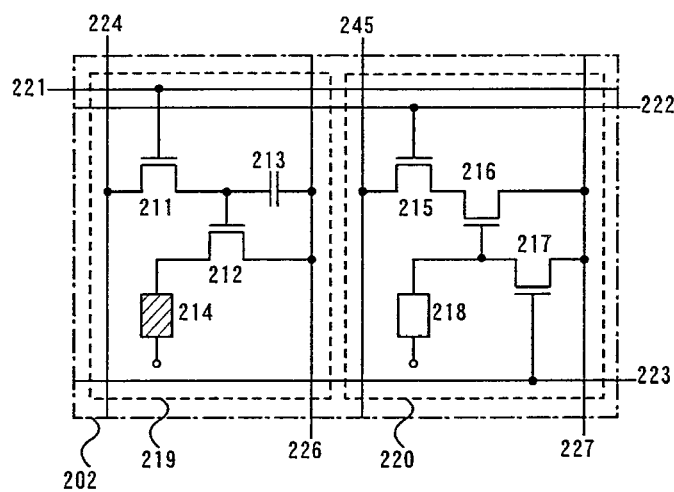

Next, an equivalent circuit schematic of the case where one pixel has a sub-pixel having a light-emitting element and a sub-pixel having an imaging device is shown FIG. 3E. In FIG. 3E, a sub-pixel 219 having a light-emitting element 214 and a sub-pixel 220 having an imaging device 218 serve as one pixel 202. Further, a signal line 224, a power supply line 226, a signal line 245, and a power supply line 227 are arranged in columns; and scan lines 221, 222, and 223 are arranged in rows. The sub-pixel 219 includes a switching transistor 211, a driver transistor 212, and a capacitor element 213; and the sub-pixel 220 includes a switching transistor 215, a buffer transistor 216, and a reset transistor 217. Note that, the above equivalent circuit schematic is only an example, and the configuration of each sub-pixel is not limited to the above description; accordingly, known circuitry can be used.

Subsequently, a technique of full color display with the use of a light-emitting element will be described with reference to FIGS. 4A to 4E. First, an RGB system will be described with reference to FIG. 4A. With the system, light emission of RGB is directly acquired by using a material emitting light of each color of RGB between an electrode 252 and an electrode 253 that are provided over a substrate 251. The system has advantages of a simple structure, and low power consumption due to high luminous efficiency compared with other systems. Next, a color conversion system (using CCM) will be described with reference to FIG. 4B. The systems uses a material emitting blue light between the electrode 252 and the electrode 253 that are provided over the substrate 251, and light emission of RGB is obtained by changing the color of blue light in a color conversion layer 254. The material emitting blue light may be formed over the entire surface; thus, the system has an advantage in the fabrication process. Next, a color filter system will be described with reference to FIG. 4C. The system uses a material emitting white light between the electrode 252 and the electrode 253 provided over the substrate 251, and light emission of RGB is obtained by transmitting the white light through a color filter 255. However, as to the white light, it is necessary to devise the layer sandwiched between both electrodes of a light-emitting element. For example, a layered structure of each light emitting material of RGB or a layered structure of each light emitting material of blue and orange may be adopted. The system uses a color filter; thus, an advantage that the technique of a liquid crystal display device can be employed.

A double sided display panel 250 of the invention has a first display surface on one surface of the substrate over which a light-emitting element and an imaging device are integrated, and a second display surface on the other side as shown in FIG. 4D. A first and a second display surfaces display either of monochrome display or color display, and the following five cases are given depending on a light emitting material included in the light-emitting element or whether the light-emitting element includes a color filter. The cases will be described with reference to FIG. 4E.

The first is a case where the light obtained from the light-emitting element is white. In this case, the first and the second display surfaces perform monochrome display. It is not illustrated; however, in this case, light obtained from the light-emitting element should be monochromatic, and may be either of RGB, for example. The second is the case where light obtained from the light-emitting element is white, and one surface of the substrate is provided with a color filter. In this case, the first display surface performs monochrome display, and the second display surface performs color display. The third is the case where light obtained from the light-emitting element is white, and a color filter is provided over the side opposite to the substrate. In this case, the first display surface performs color display, and the second display surface performs monochrome display. The fourth is the case where light obtained from the light-emitting element is white, and a color filter is provided over both one surface of the substrate and the opposite side. In this case, both the first and the second display surfaces perform color display. The fifth is the case where light obtained from the light-emitting element is either red, blue, or green. In this case, both the first and the second display surfaces perform color display.

Note that, in FIG. 4E, the case of a color filter system is shown as an example; however, naturally, a color conversion system may be used as described above. Note that, when the color conversion system is used, a material emitting blue light is used. Accordingly, when only one surface of the substrate is provided with a color conversion layer, one display surface provided with the color conversion layer is used as a main display surface, and the other display surface which performs blue monochromatic display may be used as a sub display surface.

The invention may apply any of the above cases; however, when thinning is given a priority, it is preferable to select a configuration which does not require a color filter or a color conversion layer. Further, whether to read in color or monochrome depends on whether to display in color or monochrome in the display, and there may be a case where one display surface is monochromatic and the other display surface is color depending on the configuration of the double sided display panel 250. Accordingly, when information of a subject is read in color, the reading should be performed by using the color display surface.

This embodiment can be freely combined with the embodiment mode and the embodiment above.

Embodiment 3

In this embodiment, components of a display device of the invention and relations among the components; namely, a system of a display device of the invention will be described with reference to a block diagram of FIG. 5A.

First, a double sided display panel 250 having an image sensor 306 and a CPU 303 are given as basic components. The double sided display panel 250 has integrated imaging devices and display surfaces on both sides. The double sided display panel has two functions of a read function and a display function. The double sided display panels 250 is controlled by a controller 305. Further, as for the double sided display panel 250, either the first or the second display surface provided over the both sides is controlled to display normal display, and one of horizontally reversed display, 180° rotated display, and vertically reversed display may be selected instead of the normal display as necessary by using a switching circuit 304.

When a display device of the invention is applied to a folding electronic device, the display device includes a hinge 301, and the hinge 301 is connected to a hinge switching circuit 302. Further, either the first or the second display surface provided on the both sides are controlled to display normal display, and one of, horizontally reversed display, 180° rotated display, and vertically reversed display may be selected as necessary by using the hinge switching circuit 302.

As other components aside from the above, a transmitter-receiver circuit 311, a volatile memory 312, a nonvolatile memory 313, an external interface (external IF) 314, a hard disk drive (HDD) 315 and a light emission control circuit 316 are given. The components are centrally controlled by the CPU 303. A volatile memory 312 and a nonvolatile memory 313 store information of a subject read by the imaging device. Further, a charging means 317 for charging the electronic device is given as another component, and the charging means is also controlled by the CPU 303. A display device of the invention includes a double sided display panel and the components given as above. A correction circuit 318 has a function for correcting an image signal supplied to the double sided display panel 250.

Further, when a display device of the invention is applied to a cellular phone, a microphone 307 which is a transmitter part, a speaker 308 which is a receiver part, and a button 310 which is operated by a user are given as other components aside from the above. When a user operates the button 310, information is displayed in the double sided display panel 250 via the CPU 303 and the controller 305. The speaker 308 that is to be a microphone amplifier, by which the user hears voice on the other end of the line, operates through the following circuits before the voice reaches to the user's ear. First, information of voice on the other end of the line is received in the transmitter-receiver circuit 311, and thereafter, the information is supplied to an audio controller 309 via the CPU 303. Further, the information is supplied to the speaker 308 and reached to the user's ear. When one's voice is supplied to a portable terminal of the other end of the line through the microphone 307, the reverse process is performed. Note that, some components of a cellular phone are shown in FIG. 5A; however, the invention may include other components without limitation thereto.

A light-emitting element generally deteriorates over time, and the brightness is reduced. In particular, in the case of a display device in which a plurality of pixels are respectively provided with light-emitting elements, the lighting frequency differs in each pixel; thus, the degree of deterioration inevitably differs in each pixel. Accordingly, pixels with high light frequency deteriorate badly, and the deterioration leads to burn-in; thus, the image quality degrades. The burn-in can be made less noticeable by lighting pixels having low lighting frequency during charging or the like when not in use as shown in FIG. 5B. At this time, an image displayed by all pixels lighting, an image in which the contrast of normal display (such as an idle screen) is reversed, an image in which pixels with low lighting frequency are detected and only the pixels are lighted, or the like can be displayed.

Figure 5A:
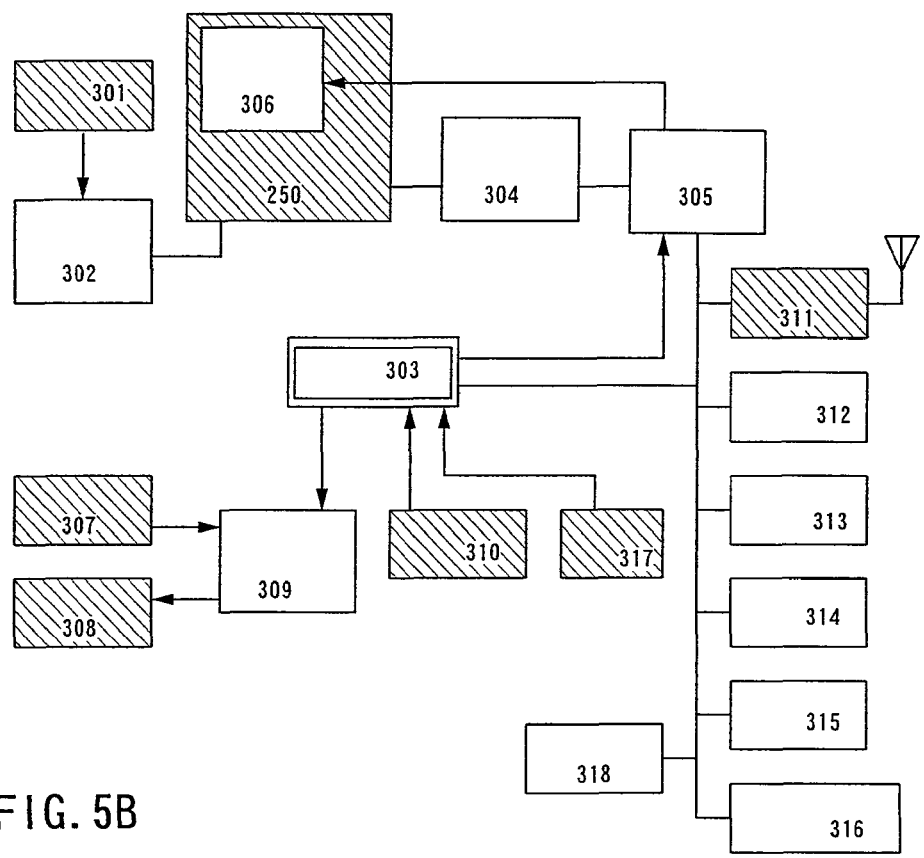
FIGS. 5A and 5B show a system of a display device of the invention.
Figure 5B:
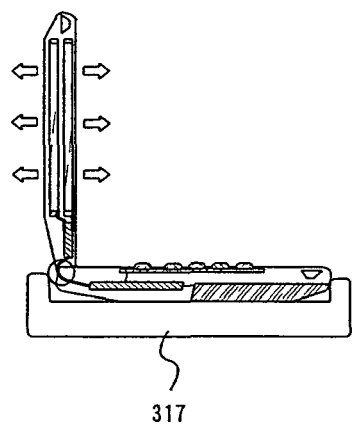

The behavior at this time is described with a block diagram of FIG. 5A. First, the case of a display device is connected to a charging means 317, and the information is supplied to the CPU 303. Thus, an image is displayed on the double sided display panel 250 by the controller 305 and a light emission control circuit (light emission control means) 316. The displayed image is a display which can suppress the burn-in. Incidentally, a charging means 317 denotes a charger or the like. The light emission control circuit 316 includes a storage medium storing a control program for lighting or blinking the light-emitting element, and a storage medium storing a control program for lighting or blinking inverted display in which the contrast of a normal display is inverted.

A display device having the above structure includes a light emission control circuit for displaying an image reducing burn-in during charging when not in normal use; thus, the deterioration of the image quality can be suppressed.

This embodiment can be freely combined with the embodiment mode and the embodiments above.

Embodiment 4

As for a double sided display panel provided for a display device of the invention, horizontally reversed display, rotated display, or vertically reversed display can be easily performed instead of normal display depending on the user's viewing angle. A display device according to the invention includes a switching circuit which can arbitrarily and easily perform switching of the display modes. In this embodiment, description on the switching circuit will be made with reference to FIGS. 6A to 6E.

Figure 6A:
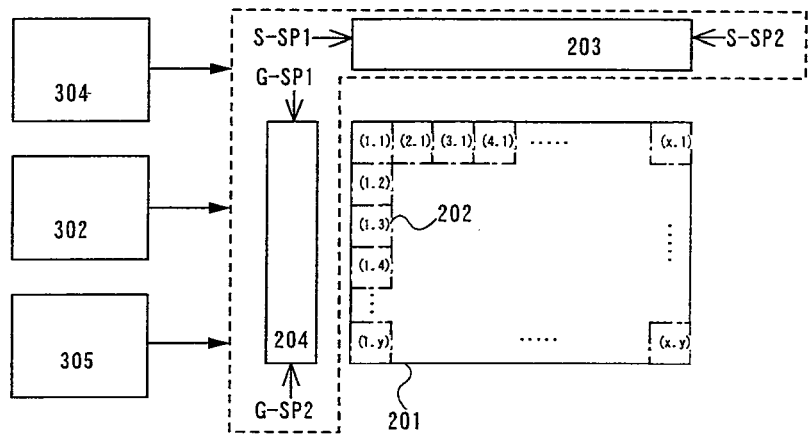
FIGS. 6A to 6E show a switching circuit included in a display device of the invention.

A double sided display panel has a pixel area 201 in which a plurality of pixels 202 are arranged in matrix, and a signal line driver circuit 203 and a scan line driver circuit 204 which are arranged around the pixel area 201 (FIG. 6A). The signal line driver circuit 203 and the scan line driver circuit 204 are connected to a hinge switching circuit 302 or a switching circuit 304, and the pixel where a start pulse is supplied from is determined according to a signal from the hinge switching circuit or the switching circuit. More specifically, S-SP1 is supplied when the pixel is selected from the first column. Further, S-SP2 is supplied when the pixel is selected from a column x. Further G-SP1 is supplied when the pixel is selected from the first row. Further, G-SP2 is supplied when the pixel is selected from a row y.

Figure 6B:
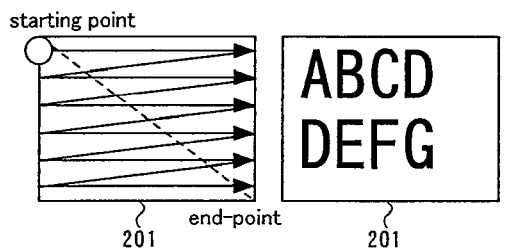
Figure 6C:
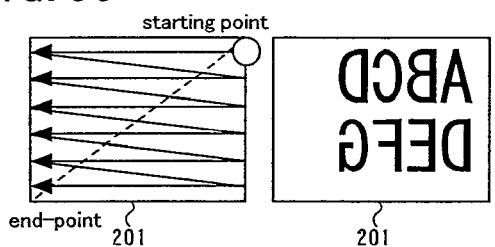
Figure 6D:
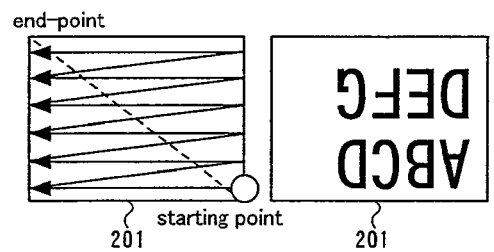
Figure 6E:
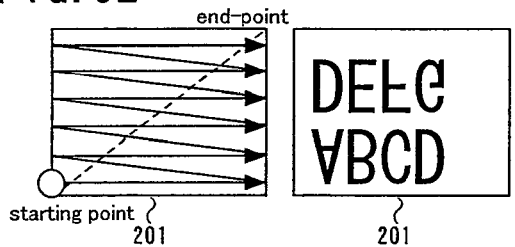

When normal display is performed, start pulses (S-SP1 and G-SP1) are supplied so that the pixel 202 located in column 1, row 1 is selected first (FIG. 6B). When horizontally reversed display is performed, start pulses (S-SP2 and G-SP1) are supplied so that the pixel 202 located at column x, row 1 is selected first (FIG. 6C). When 180° rotated display is performed, start pulses (S-SP2 and G-SP2) are supplied so that the pixel 202 located at column x, row y is selected first (FIG. 6D). When vertically reversed display is performed, start pulses (S-SP1 and G-SP2) are supplied so that the pixel 202 located at column 1, row y is selected first (FIG. 6E). Thus, the pixel to which start pulses are supplied is changed according to the display mode: horizontally reversed display, rotated display, or vertically reversed display. Likewise, a video signal which is supplied from the signal line driver circuit is changed appropriately.

When a time division gray scale method is applied to the panel, a video signal is read in a storage medium, and is changed thereafter into a video signal for time division gray scale. Accordingly, the order of reading video signals is changed according to the display mode: horizontally reversed display, rotated display, or vertically reversed display, and the video signals are stored in the storage medium, thereby corresponding to each display mode.

The switching circuit 304 is preferably used when switching is performed in accordance with the button operation of a user. Namely, it is preferable to determine the orientation of normal display, and to use the switching circuit is used when the orientation of display is changed, as necessary. Further, the hinge switching circuit 302 is effectively used when a display device of the invention is used for a portable terminal. For example, when a case is opened, the hinge switching circuit is controlled so that a display surface inside performs normal display, and when the case is closed, the hinge switching circuit is controlled so that the display surface outside performs normal display.

This embodiment can be freely combined with the embodiment mode and the embodiments above.

Embodiment 5

A double sided display panel of the invention has two functions of a display function and a read function. In this embodiment, the switching of the display function and a read function will be described with reference to a flow chart in FIG. 7A.

First, a display device having a double sided display panel is started. When the display device is started, a display mode is operated automatically; a display area is made ON, and a sensor area is made OFF. Here, the display area denotes all the sub-pixels including light-emitting elements, and the sensor area denotes all the sub-pixels including imaging devices. Further, normal display, horizontally reversed display, 180° rotated display, or vertically reversed display is performed in the display area according to a signal supplied from the hinge switching circuit 302 or the switching circuit 304. Meanwhile, when a read mode is operated according to a signal from the exterior such as a button 310, the display area and the sensor area are both made ON. Then, information of a subject is read by the sensor area by using the display area as a light source.

Figure 7A:
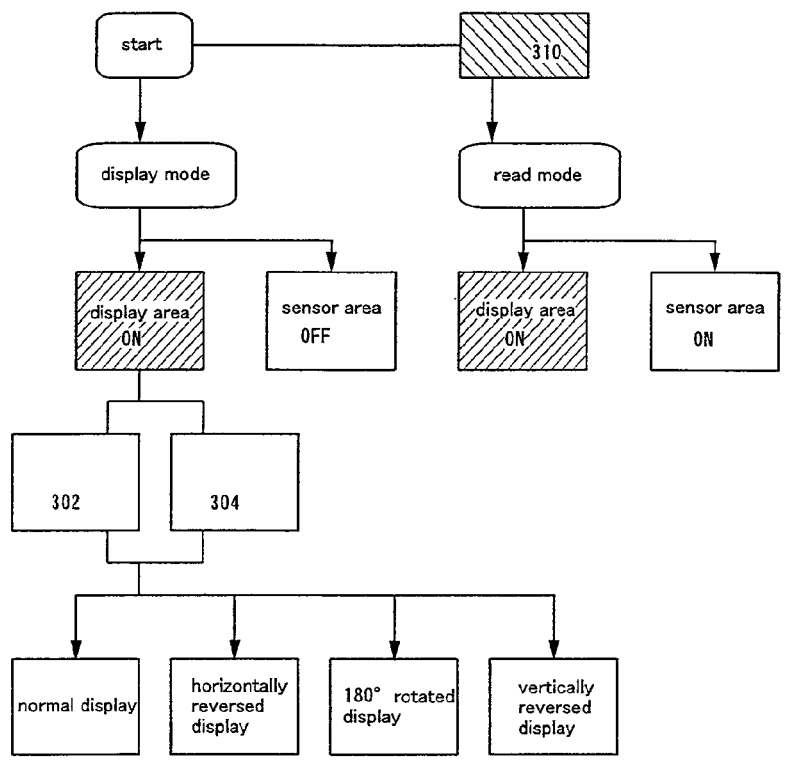
FIGS. 7A to 7C show a display mode and a reading mode.
Figure 7B:
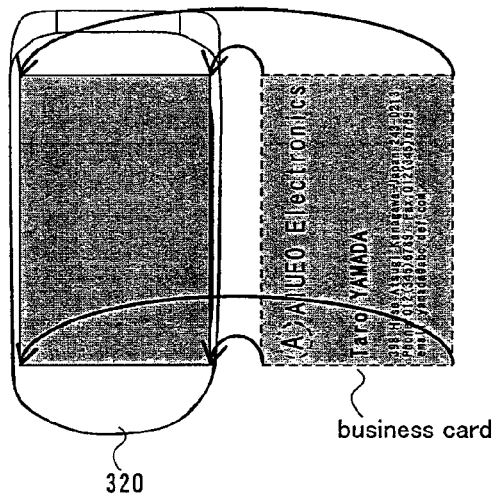
Figure 7C:
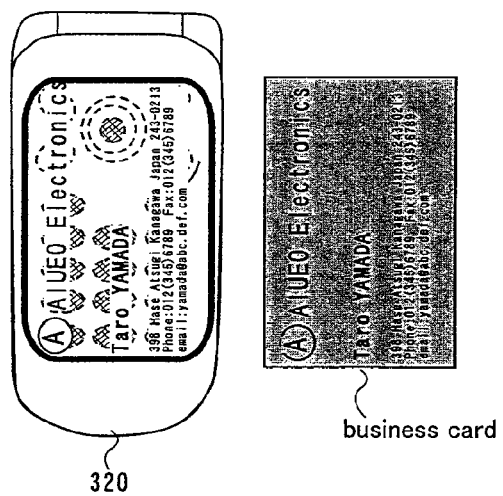

The operation hereat will be described by taking an example of an operation of reading a name card using a folding portable terminal 320 with reference to FIGS. 7B and 7C. First, in read mode, a business card is laid in a manner that external light is prevented from entering the display panel, thereby reading information of the name card (FIG. 7B). The read information is stored in a storage medium in the portable terminal. Subsequently, in display mode, display is performed in the display area based on the information of the read business card (FIG. 7C).

Thus, a display device of the invention has two functions of an image sensor function to read information of a subject and a display function to display an image. Despite the display device of the invention has such two functions, a light source or a light scatterer which are usually required in the case of using an image sensor function are not required to be provided separately. Therefore, the display device can be made far smaller, thinner, and lighter. At this point, a light emitting element carries out two functions of serving as a light source for reading information of the subject and of displaying an image.

Figure 8A:
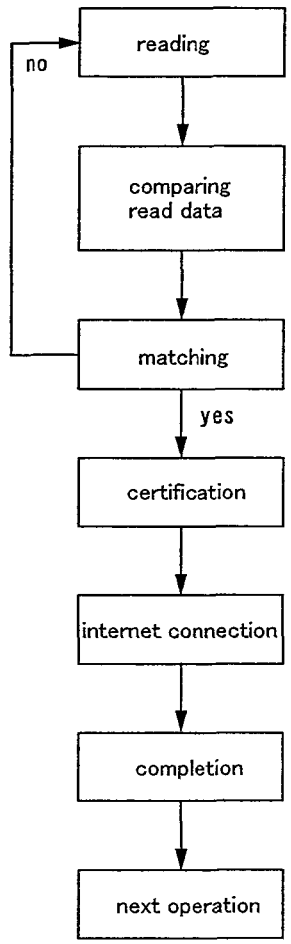
FIGS. 8A to 8C show a fingerprint authentication system.

Next, a personal identification system utilizing the read function will be described with reference to a flow chart in FIG. 8A.

Figure 8B:
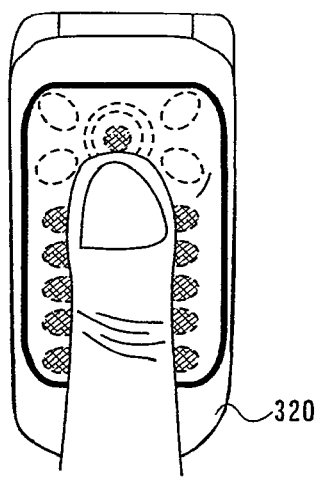
Figure 8C:
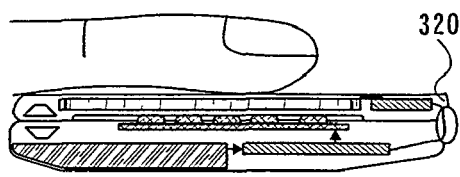

First, biological information of a person is read by using an image sensor provided in the double sided display panel. Here, the biological information denotes physical characteristics which human beings have by nature and which can be identified personally. A fingerprint, a palm print, a voiceprint, a handprint, an iris, and the like are given as typical biological information. Taking the size of the display surface into account, a fingerprint, especially a fingerprint of a thumb is preferable for the biological information to be read. Fingerprints are preferable since no two pieces of information between different fingerprints are exactly the same and the fingerprint is unchangeable during life. A top view and a cross-sectional view of a situation where a fingerprint is read by using a double sided display panel provided for a portable terminal 320 are shown in FIGS. 8B and 8C. As shown, it is preferable to read a fingerprint as the finger is in contact with the panel, thereby obtaining accurate information. The mechanism of reading a fingerprint is such that a pattern of the fingerprint is read by exposing the finger with light and reading the light scattered at the finger.

The obtained biological information is compared with information stored in a storage medium previously provided in the portable terminal, via a CPU. If the two pieces of the information agree with each other, the user is certified as the genuine user of the portable terminal. Thereafter, the user can perform a process (here, internet connection). The next operation can be performed after the process is completed. Note that, when the obtained biological information does not match, the read operation should be performed again.

It is preferable to use a personal identification system of this embodiment before all processes that cause trouble when are operated by other people, such as fee-based information processing and rewriting process of a storage medium of a portable terminal. Thus, an illegal process using a portable terminal can be prevented. There is a technique for an identification system, in which a personal number and a password are used. However, with the technique, the storage/management of users would not be fully performed, or the stored information would be relatively stolen easily. Accordingly, the security of personal information can be remarkably improved by using fingerprint information as this system. Further, as a read method, a roller type in which reading is performed by rotating a roller with a finger, an oblong shape type in which a finger is shifted on a module little by little, and a plane type in which a finger is pressed against a module, which is adopted to the invention, are given. As for the plane type, the shape of a fingerprint is hardly changed since the reading is performed without moving a finger. Further, the plane type has an advantage over the roller type in thinness.

Figure 17A:
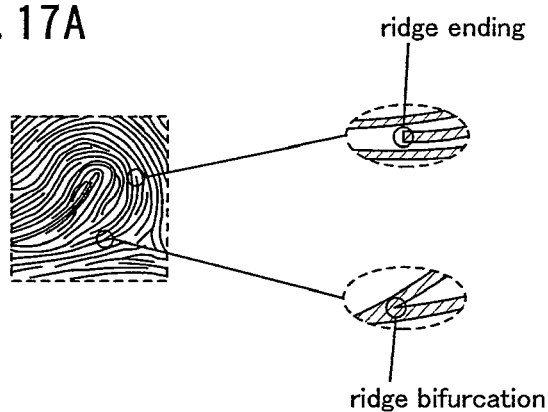
FIGS. 17A and 17B describes fingerprint authentication.

Next, mechanism of fingerprint authentication employed for the personal identification system above will be described in more detail with reference to FIGS. 17A and 17B. As for a fingerprint, the portion forming a pattern, which is raised is called a ridge, the portion where the ridge ends is called a ridge ending, and a portion where the ridge forks is called a ridge bifurcation (FIG. 17A). The ridge ending and ridge bifurcation are collectively called as minutiae points, and in the case of fingerprint authentication, the minutiae points are handled as basic information.

Figure 17B:
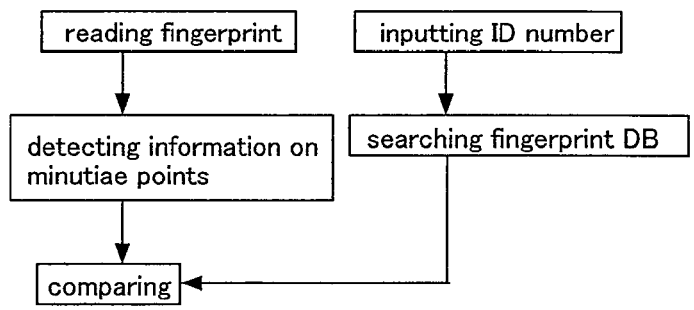

The mechanism of fingerprint authentication is broadly divided into two methods (FIG. 17B). As the first method, a fingerprint is read first, information on minutiae points is detected thereafter, and the fingerprint that is inputted last and all the fingerprints archived are compared, thereby searching matched fingerprints. As the second method, an ID number is inputted at the same time when a fingerprint is read first, a fingerprint database is searched thereafter, and after identifying the fingerprints by the ID number, the fingerprints are compared thereby identifying a person. In the invention, either method may be employed.

This embodiment can be freely combined with the embodiment mode and the embodiments above.

Embodiment 6

In this embodiment, a correction method for correcting information of a read subject will be described with reference to an equivalent circuit schematic in FIG. 3E and FIG. 9.

First, the behavior of a sub-pixel 220 including an imaging device 218 shown in FIG. 3E will be briefly described below. Here, transistors 215 and 216 shall be an n-channel type, and a transistor 217 shall be a p-channel type. First, a scan line 223 is selected and the transistor 217 is turned ON. Then, a potential $V_{PD}$ between both electrodes of the imaging device 218 becomes equal to the high potential voltage $V_{DD}$ that is a potential of a power line 227 (point A in FIG. 9). When the imaging device 218 is exposed to light, the $V_{PD}$ is reduced. When a scan line 222 is selected at a certain time, a signal corresponding to the $V_{PD}$ of the imaging device 218 then is read (points B and C in FIG. 9). Further, when one frame is finished, the scan line 223 is selected and $V_{PD}$ becomes equal to $V_{DD}$ (point E in FIG. 9).

Figure 9:
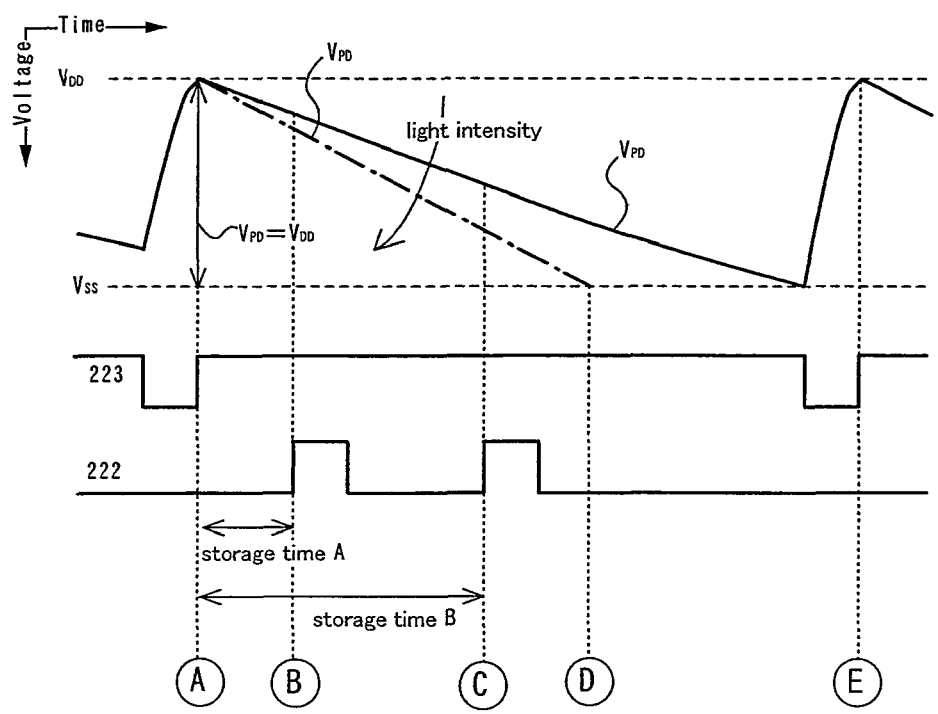
FIG. 9 shows a correction system.

In FIG. 9, a situation where bright light is emitted is shown by dashed lines, and a situation where dark light is emitted is shown by solid lines. As shown, as the light intensity is high, the potential of $V_{PD}$ soon approaches $V_{SS}$. Also, as the storage time is long, the potential of $V_{PD}$ soon approaches $V_{SS}$. This is because as the light intensity is high, the amount of stored charge generated by the given light increases, and as the storage time is long, more charge which is generated by the given light can be stored. Further, when bright light is emitted, saturation is reached more easily than the case of dark light (point D in FIG. 9). The saturation denotes a state where the potential difference between the both electrodes of the imaging device 218 becomes zero. Once the saturation occurs, the potential difference between the both electrodes of the imaging device 218 does not change until resetting.

When a subject is read by a double sided display panel of the invention, the imaging device 218 is exposed to excess light due to light emission to both sides, and the saturation is reached earlier than normal as a result. Therefore, information of a subject cannot be read accurately. Correspondingly, a method for reading a subject in a shorter storage time than normal can be proposed as a correction method. For example, when reading is normally performed in storage time B, reading shall be performed in a shorter storage time A in the case of using the panel. Further, as another correction method, a method in which information (signal) of the read subject is corrected can be proposed. For example, the information of the subject is equivalent to the current value corresponding to the potential difference $V_{PD}$ between the both electrodes of the imaging device 218, a read current value added with several amperes of current value, for example, shall be the information of the subject. Thus, more accurate information of a subject can be obtained by employing either or both a method in which correction is performed at the time of reading a subject and a method in which the information of the read subject is corrected.

This embodiment can be freely combined with the embodiment mode and the embodiments above.

Embodiment 7

In this embodiment, an example of a structure of a sub-pixel including a light-emitting element will be described with reference to FIGS. 13A to 13F.

Figure 13A:
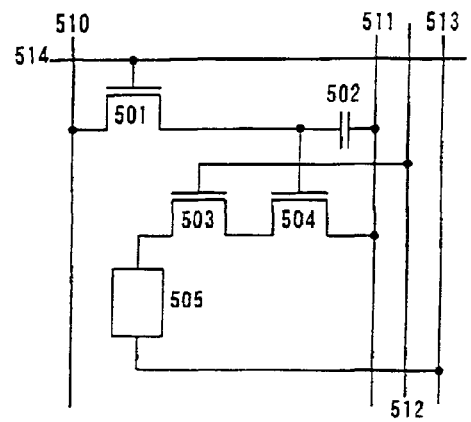
FIGS. 13A to 13F show an equivalent circuit schematic of a pixel of a display device of the invention.

In a pixel shown in FIG. 13A, a signal line 510 and power supply lines 511 to 513 are arranged in columns, and a scan line 514 is arranged in a row. The pixel also includes a switching transistor 501, a driver transistor 503, a current controlling transistor 504, a capacitor element 502, and a light-emitting element 505.

Figure 13B:
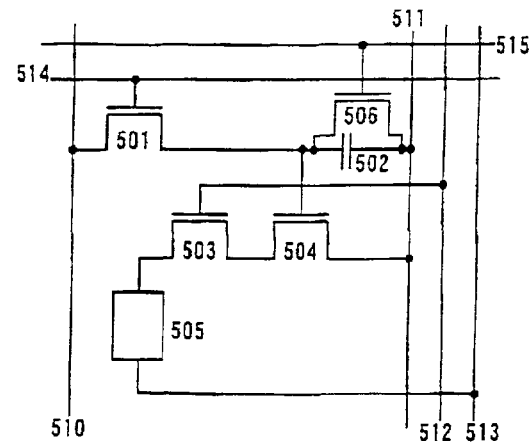
Figure 13C:
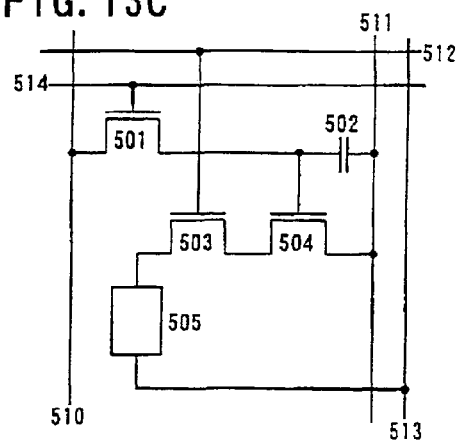
Figure 13D:
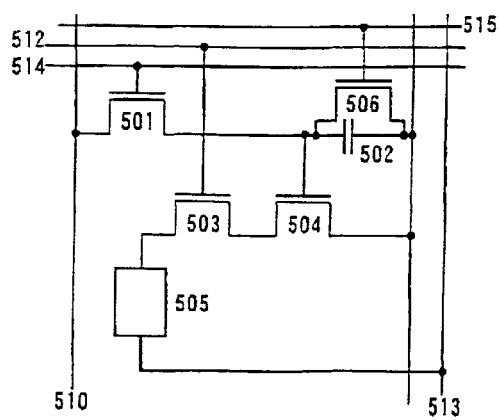

A pixel shown in FIG. 13C has the same configuration as the one shown in FIG. 13A, except that a gate electrode of the transistor 503 is connected to the power supply line 513 arranged in a row. Both pixels in FIGS. 13A and 13C show the same equivalent circuit schematic. However, the power supply lines are formed from conductors in different layers in between the cases where the power supply line 513 is arranged in a column (FIG. 13A) and where the power supply line 513 is arranged in a row (FIG. 13C). The two pixels are each shown in FIGS. 13A and 13C in order to show that layers for forming a wiring connected to the gate electrode of the transistor 503 are different in between FIG. 13A and FIG. 13C.

In both FIGS. 13A and 13C, the transistors 503 and 504 are connected in series in the pixel, and the ratio of the channel length $L_3$/the channel width $W_3$ of the transistor 503 to the channel length $L_4$/the channel width $W_4$ of the transistor 504 is set as $L_3/W_3:L_4/W_4$=5 to 6000:1. For example, when $L_3$, $W_3$, $L_4$, and $W_4$ are 500 μm, 3 μm, 3 μm, and 100 μm respectively.

The transistor 503 is operated in a saturation region and controls the amount of current flowing in the light-emitting element 505, whereas the transistor 504 is operated in a linear region and controls whether a current is supplied to the light-emitting element 505 or not. The transistors 503 and 504 preferably have the same conductivity in view of the fabrication steps. For the transistor 503, a depletion mode transistor may be used instead of an enhancement mode transistor. According to the invention having the aforementioned structure, slight variations in $V_{GS}$ of the transistor 504 does not affect the amount of current flowing in the light-emitting element 505, since the transistor 504 is operated in a linear region. Namely, the amount of current flowing in the light-emitting element 505 is determined by the transistor 503 operated in a saturation region. Accordingly, it is possible to provide a display device in which brightness variations due to variations in characteristics of transistors are reduced and image quality is improved.

The transistor 501 in FIGS. 13A to 13D controls a video signal input to the pixel. When the transistor 501 is turned ON and a video signal is inputted to the pixel, the video signal is held in the capacitor element 502. Although the pixel includes the capacitor element 502 in FIGS. 13A to 13D, the invention is not limited thereto. When a gate capacitance and the like can serve as a capacitor for holding a video signal, the capacitor element 502 is not necessarily provided.

The light-emitting element 505 have a structure in which an electroluminescent layer is sandwiched between a pair of electrodes. A pixel electrode and a counter electrode (an anode and a cathode) have a potential difference in order that a forward bias voltage is applied to the light-emitting element 505. The electroluminescent layer is formed of at least one material selected from various organic materials, inorganic materials, and the like. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 13B has the same configuration as the one shown in FIG. 13A, except that a transistor 506 and a scan line 515 are added. Similarly, a pixel shown in FIG. 13D has the same configuration as the one shown in FIG. 13C, except that the transistor 506 and the scan line 515 are added.

The transistor 506 is controlled to be ON/OFF by the added scan line 515. When the transistor 506 is turned ON, charges held in the capacitor element 502 are discharged, thereby turning the transistor 504 OFF. Namely, supply of a current to the light-emitting element 505 can be forcibly stopped by providing the transistor 506. Accordingly, by adopting the configurations shown in FIGS. 13B and 13D, a lighting period can start simultaneously with or shortly after a writing period starts before signals are written into all the pixels, thus, the duty ratio can be improved.

Figure 13E:
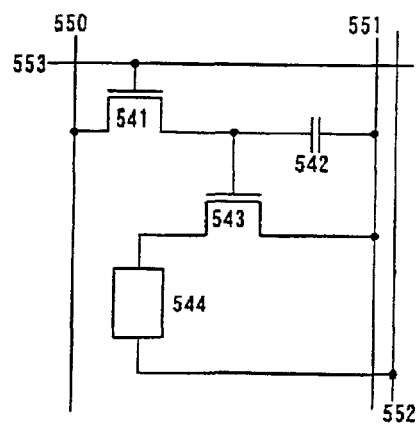
Figure 13F:
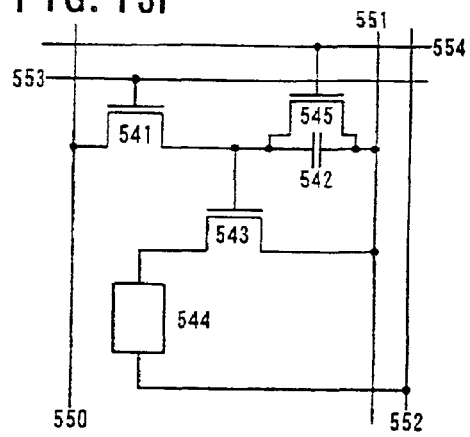

In a pixel shown in FIG. 13E, a signal line 550 and power supply lines 551 and 552 are arranged in columns, and a scan line 553 is arranged in a row. The pixel further includes a switching transistor 541, a driver transistor 543, a capacitor element 542, and a light-emitting element 544. A pixel shown in FIG. 13F has the same configuration as the one shown in FIG. 13E, except that a transistor 545 and a scan line 554 are added. It is to be noted that the configuration of FIG. 13F also allows the duty ratio to be improved by providing the transistor 545.

This embodiment can be freely combined with the embodiment mode and the embodiments above.

Embodiment 8

Examples of the electronic devices employing the present invention can be given as follows: a video camera, a digital camera, a goggle type display, a navigation system, an audio reproducing apparatus such as a car audio, a notebook personal computer, a game machine, a personal digital assistant (a mobile computer, a cellular phone, a portable game machine, an electronic book, or the like), and an image reproducing device including a recording medium of a game machine or the like (specifically, a device which can play a recording medium such as a Digital Versatile Disk (DVD) and which can display the image). Practical examples thereof are shown in FIGS. 10A to 12E.

FIGS. 10A to 10F show a portable cellular phone including a speaker 9301, a button 9303, a microphone 9304, and a double sided display panel 9307. FIGS. 10A to 10C show an open state, and a first display surface 9305 can be seen inside, and a second display surface 9306 can be seen outside. FIGS. 10D to 10F show a folded state, and the second display surface 9306 outside can be seen. The invention can be applied to a display device having the first display surface 9305 and the second display surface 9306 provided over both sides.

Figure 11A:
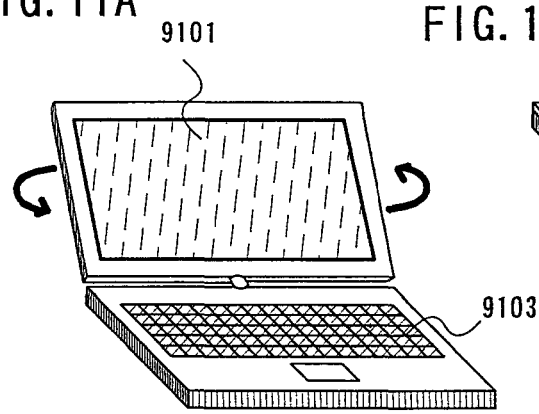
FIGS. 11A to 11D show an electronic device using a display device of the invention.
Figure 11B:
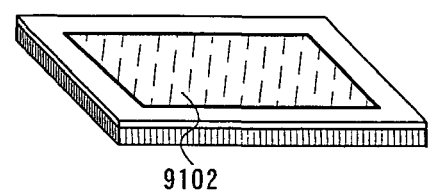
Figure 11C:
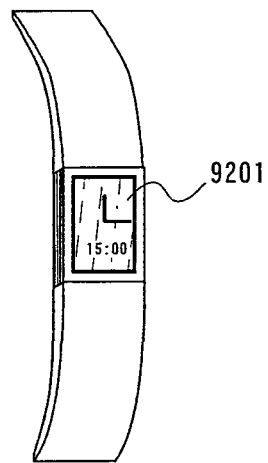
Figure 11D:
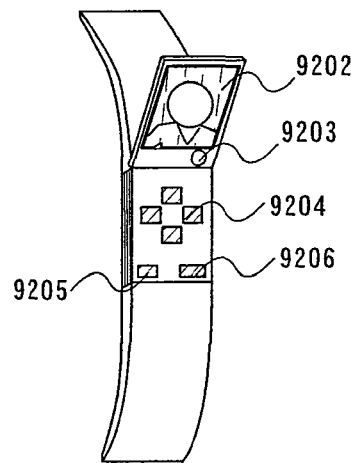

FIGS. 11A and 11B show a tablet PC among portable terminals, including display areas 9101 and 9102 and a button 9103. The display area 9101 is used when open, and the display area 9102 and the like are used when folded. The both display areas 9101 and 9102 can be used by turning the electronic device around a rotation axis. The invention can be applied to a display device having the display areas 9101 and 9102 provided on both sides. FIGS. 11C and 11D show a wristwatch portable terminal including display areas 9201 and 9202, a camera 9203, a button 9204, a microphone 9205, and a speaker 9206. The invention can be applied to a display device having the display areas 9201 and 9202 provided on both sides.

Figure 12A:
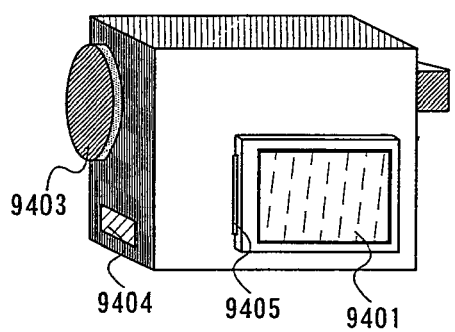
FIGS. 12A to 12E show an electronic device using a display device of the invention.
Figure 12B:
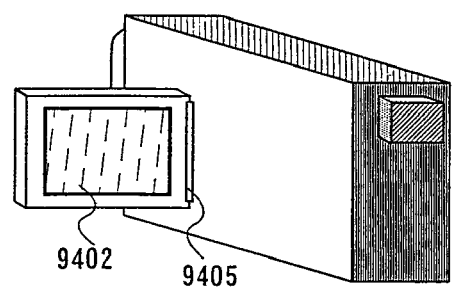
Figure 12C:
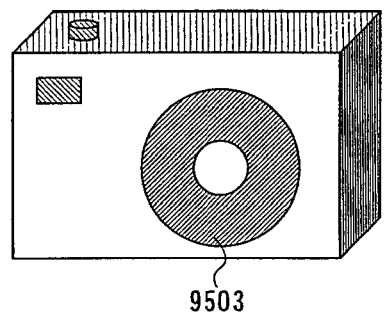
Figure 12D:
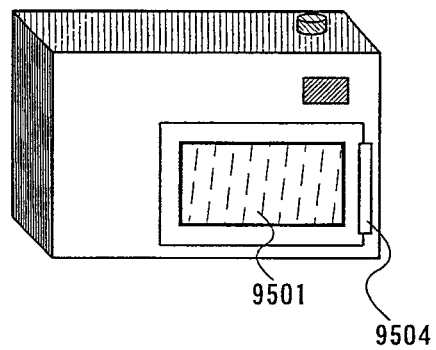
Figure 12E:
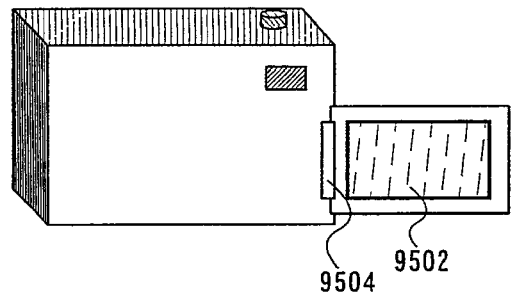

FIGS. 12A and 12B show a digital video camera including display areas 9401 and 9402, a lens 9403, a microphone 9404, and a hinge 9405. The invention can be applied to a display device having the display areas 9401 and 9402 provided on both sides. FIGS. 12C to 12E show a digital camera including display areas 9501 and 9502, a lens 9503, and a hinge 9504. The invention can be applied to a display device having the display areas 9501 and 9502 provided on both sides.

This embodiment can be freely combined with the embodiment mode and the embodiments above.

The present invention can provide a display device and an electronic device having display surfaces on both sides, in which more sophistication and a high added value are realized by obtaining a read function by incorporating an imaging device, and by using a panel with small volume. Further, the invention can provide a folding electronic device in which a display surface inside can be seen without opening and a display surface outside can be seen without closing the electronic device.

A light-emitting element included in a display device according to the invention has two functions of serving as a light source when information of a subject is read and displaying an image. Further, a display device according to the invention has two functions of an image sensor function to read information of a subject and a display function to display an image. Despite the display device of the invention has such two functions, a light source or a light scatterer which are usually required in the case of using an image sensor function are not required to be provided separately. Therefore, the display device can be made far smaller, thinner, and lighter.

What is claimed is:

1. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface; and
a transistor and a light-emitting element between the top surface of the substrate and the first display surface, the transistor being electrically connected to the light-emitting element,
wherein the light-emitting element emits light to the first display surface and to the second display surface,
wherein light emitted by the light-emitting element reaches the first display surface and the second display surface by passing through one polarizer only,
wherein light obtained from the light-emitting element is white, and
wherein each of the first display surface and the second display surface performs monochrome display.

2. A display device according to claim 1, further comprising an imaging device configured to generate signal charge in response to incident light over the top surface of the substrate.

3. A display device according to claim 2, wherein the imaging device includes an amorphous semiconductor.

4. A display device according to claim 2, the light-emitting element comprising an electrode, the electrode comprising an opening overlapping with the imaging device.

5. A display device according to claim 2, wherein an opening overlapping with the imaging device is provided in one or more of the two polarizers.

6. An electronic device selected from the group consisting of a portable cellular phone, a tablet PC, a wristwatch portable terminal, a digital video camera, and a digital camera comprising the display device according to claim 1.

7. A display device according to claim 1, wherein the display device has a switching circuit which controls a display of the first display surface or the second display surface.

8. A display device according to claim 7, wherein the display is selected from a group consisting of a normal display, a horizontally reversed display, a 180° rotated display and a vertically reversed display.

9. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface;
a transistor and a light-emitting element between the top surface of the substrate and the first display surface, the transistor being electrically connected to the light-emitting element; and
a color filter below the bottom surface of the substrate,
wherein the light-emitting element emits light to the first display surface and to the second display surface,
wherein light emitted by the light-emitting element reaches the first display surface and the second display surface by passing through one polarizer only,
wherein light obtained from the light-emitting element is white, and
wherein the first display surface performs monochrome display and the second display surface performs color display.

10. A display device according to claim 9, further comprising an imaging device configured to generate signal charge in response to incident light over the top surface of the substrate.

11. A display device according to claim 10, wherein the imaging device includes an amorphous semiconductor.

12. A display device according to claim 10, the light-emitting element comprising an electrode, the electrode comprising an opening overlapping with the imaging device.

13. A display device according to claim 10, wherein an opening overlapping with the imaging device is provided in one or more of the two polarizers.

14. An electronic device selected from the group consisting of a portable cellular phone, a tablet PC, a wristwatch portable terminal, a digital video camera, and a digital camera comprising the display device according to claim 9.

15. A display device according to claim 9, wherein the display device has a switching circuit which controls a display of the first display surface or the second display surface.

16. A display device according to claim 15, wherein the display is selected from a group consisting of a normal display, a horizontally reversed display, a 180° rotated display and a vertically reversed display.

17. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface;
a transistor and a light-emitting element between the top surface of the substrate and the first display surface, the transistor being electrically connected to the light-emitting element; and
a color filter above the top surface of the substrate and the light-emitting element,
wherein the light-emitting element emits light to the first display surface and to the second display surface,
wherein light emitted by the light-emitting element reaches the first display surface and the second display surface by passing through one polarizer only,
wherein light obtained from the light-emitting element is white, and
wherein the first display surface performs color display and the second display surface performs monochrome display.

18. A display device according to claim 17, further comprising an imaging device configured to generate signal charge in response to incident light over the top surface of the substrate.

19. A display device according to claim 18, wherein the imaging device includes an amorphous semiconductor.

20. A display device according to claim 18, the light-emitting element comprising an electrode, the electrode comprising an opening overlapping with the imaging device.

21. A display device according to claim 18, wherein an opening overlapping with the imaging device is provided in one or more of the two polarizers.

22. An electronic device selected from the group consisting of a portable cellular phone, a tablet PC, a wristwatch portable terminal, a digital video camera, and a digital camera comprising the display device according to claim 17.

23. A display device according to claim 17, wherein the display device has a switching circuit which controls a display of the first display surface or the second display surface.

24. A display device according to claim 23, wherein the display is selected from a group consisting of a normal display, a horizontally reversed display, a 180° rotated display and a vertically reversed display.

25. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface;
a transistor and a light-emitting element between the top surface of the substrate and the first display surface, the transistor being electrically connected to the light-emitting element;
a first color filter above the top surface of the substrate and the light-emitting element; and
a second color filter below the bottom surface of the substrate,
wherein the light-emitting element emits light to the first display surface and to the second display surface,
wherein light emitted by the light-emitting element reaches the first display surface and the second display surface by passing through one polarizer only,
wherein light obtained from the light-emitting element is white, and
wherein the first display surface performs color display and the second display surface performs color display.

26. A display device according to claim 25, further comprising an imaging device configured to generate signal charge in response to incident light over the top surface of the substrate.

27. A display device according to claim 26, wherein the imaging device includes an amorphous semiconductor.

28. A display device according to claim 26, the light-emitting element comprising an electrode, the electrode comprising an opening overlapping with the imaging device.

29. A display device according to claim 26, wherein an opening overlapping with the imaging device is provided in one or more of the two polarizers.

30. An electronic device selected from the group consisting of a portable cellular phone, a tablet PC, a wristwatch portable terminal, a digital video camera, and a digital camera comprising the display device according to claim 25.

31. A display device according to claim 25, wherein the display device has a switching circuit which controls a display of the first display surface or the second display surface.

32. A display device according to claim 31, wherein the display is selected from a group consisting of a normal display, a horizontally reversed display, a 180° rotated display and a vertically reversed display.

33. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface; and
a transistor and a light-emitting element between the top surface of the substrate and the first display surface, the transistor being electrically connected to the light-emitting element,
wherein the light-emitting element emits light to the first display surface and to the second display surface,
wherein light emitted by the light-emitting element reaches the first display surface and the second display surface by passing through one polarizer only,
wherein light obtained from the light-emitting element is red, blue, or green, and
wherein the first display surface performs color display and the second display surface performs color display.

34. A display device according to claim 33, further comprising an imaging device configured to generate signal charge in response to incident light over the top surface of the substrate.

35. A display device according to claim 34, wherein the imaging device includes an amorphous semiconductor.

36. A display device according to claim 34, the light-emitting element comprising an electrode, the electrode comprising an opening overlapping with the imaging device.

37. A display device according to claim 34, wherein an opening overlapping with the imaging device is provided in one or more of the two polarizers.

38. An electronic device selected from the group consisting of a portable cellular phone, a tablet PC, a wristwatch portable terminal, a digital video camera, and a digital camera comprising the display device according to claim 33.

39. A display device according to claim 33, wherein the display device has a switching circuit which controls a display of the first display surface or the second display surface.

40. A display device according to claim 39, wherein the display is selected from a group consisting of a normal display, a horizontally reversed display, a 180° rotated display and a vertically reversed display.

41. A display device comprising:
a substrate which transmits light;
a first display surface above a top surface of the substrate;
a second display surface below a bottom surface of the substrate;
a counter substrate opposite to the substrate;
two polarizers of different polarizations sandwiching the substrate and the counter substrate and between the first display surface and the second display surface; and
a transistor and a light-emitting element between the top surface of the substrate and the first display surface, the transistor being electrically connected to the light-emitting element,
wherein the light-emitting element emits light to the first display surface and to the second display surface, and
wherein light emitted by the light-emitting element reaches the first display surface and the second display surface by passing through one polarizer only.

* * * * *

UNITED STATES PATENT AND TRADEMARK OFFICE
CERTIFICATE OF CORRECTION

| | |
|---|---|
| PATENT NO. | : 8,482,484 B2 |
| APPLICATION NO. | : 11/620439 |
| DATED | : July 9, 2013 |
| INVENTOR(S) | : Yamazaki et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1234 days.

Signed and Sealed this
Tenth Day of February, 2015

Michelle K. Lee
*Deputy Director of the United States Patent and Trademark Office*